(12) United States Patent
Appelt et al.

(10) Patent No.: US 6,207,595 B1
(45) Date of Patent: *Mar. 27, 2001

(54) LAMINATE AND METHOD OF MANUFACTURE THEREOF

(75) Inventors: Bernd K. Appelt, Endicott; Lawrence R. Blumberg, Johnson City; William T. Fotorny; Ross D. Havens, both of Endicott; Robert M. Japp, Vestal; Kostas Papathomas, Endicott; Jan Obrzut, Vestal; Mark D. Poliks, Vestal; Amarjit S. Rai, Vestal, all of NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/033,505

(22) Filed: Mar. 2, 1998

(51) Int. Cl.[7] ................................................. B32B 27/04
(52) U.S. Cl. ...................... 442/117; 442/176; 442/180; 427/389.9; 427/389.8
(58) Field of Search .................................... 442/117, 176, 442/180; 427/389.8, 389.9

(56) References Cited

U.S. PATENT DOCUMENTS

| 4,579,772 | 4/1986 | Bhatt et al. ............................ 428/229 |
| 4,713,137 | * 12/1987 | Sexton ................................. 156/233 |
| 4,783,345 | 11/1988 | Kleeberg et al. ......................... 427/96 |
| 5,368,921 | 11/1994 | Ishii et al. ............................. 428/228 |
| 5,376,453 | 12/1994 | von Gentzkow et al. ............. 428/415 |
| 5,483,101 | 1/1996 | Shimoto et al. ....................... 257/701 |
| 5,565,267 | 10/1996 | Capote et al. ......................... 428/344 |
| 5,648,171 | 7/1997 | von Gentzkow et al. ............ 428/413 |
| 5,670,262 | 9/1997 | Dalman ................................. 428/458 |
| 5,677,045 | 10/1997 | Nagai et al. ........................... 428/260 |

FOREIGN PATENT DOCUMENTS

| 56-49271 | 5/1981 | (JP) | ................................. B32B/27/42 |
| 7-86710 | 3/1995 | (JP) | ................................. H05K/1/03 |
| 7-97466 | 4/1995 | (JP) | ................................. C08J/5/24 |
| 8-92394 | 4/1996 | (JP) | ................................. C08J/5/24 |

OTHER PUBLICATIONS

Listing of Major Subsidiaries and Affiliates of Asahi Company (Printed from the Internet on Aug. 31, 1999).*

JEDEC Standard No. 22–A110, Jul. 1988, "Test Method A110 Highly–Accelerated Temperature and Humidity Stress Test (HAST)", from JEDEC Council Ballot JCB–88–2, formulated under the cognizance of JC–14–1 Committee on Transportaion/Automotive Electronics.

ANSI/IPC–RB–276, Mar. 1992, "Qualification and performance Specification for Rigid Printed Boards", American National Standards Institute.

JEDEC Standard No. 22–A112, Apr. 1994, "Moisture–Induced Stress Sensitivity for Plastic Surface Mount Devices", from JEDEC Council Ballot JCB–94–03, formulated under the cognizance of JC–14.1 Committee on Reliability Test Methods for Packaged Devices.

JEDEC Standard No. 22–A113–A, Jun. 1995, "Preconditioning of Plastic Surface Mount Devices Prior to Relibiality Testing", from JEDEC Council Ballot JCB–95–18, formulated under the cognizance of JC–14.1 Committee on Reliabilty Test Methods for Packaged Devices.

* cited by examiner

Primary Examiner—Elizabeth M. Cole
Assistant Examiner—Arti Singh
(74) Attorney, Agent, or Firm—John R. Pivnichny

(57) ABSTRACT

A fabric material and method of its manufacture suitable for use in electronic packages including chip carriers. High insulation resistance is exhibited when subjected to high temperatures and humidity stress conditions.

8 Claims, 3 Drawing Sheets

LAMINATE AND METHOD OF MANUFACTURE THEREOF

TECHNICAL FIELD

The invention relates to insulative laminate materials for use in electronic packages and more particularly to resin and fiber composites which exhibit a high insulation resistance when subjected to severe moisture, temperature, and pressure conditions.

BACKGROUND OF THE INVENTION

Insulative laminate materials are conventionally prepared by impregnating non-woven or woven fiber fabrics (typically glass) with thermosetting resin compositions such as epoxy or bismaleimide-triazine (BT) resins and then drying the fabric. The dried fabric is cut into sheets, referred to in the printed circuit industry as prepregs which are then laminated to solid or personalized electrically conductive layers (typically copper) in various combinations including other previously laminated structures to form single or multi layer substrates.

Holes or vias having electrically conductive walls filled with electrically conductive materials may be formed in the substrate to provide electrical contact between the conductive layers. Numerous other variations to the art of substrate manufacture are well known. The substrates are used to hold electronic components including semiconductors, passive components other substrates, and miscellaneous components such as connectors, switches, or the like and to provide electrical interconnection between appropriate contacts on these components.

The prepreg must exhibit a large number of properties to be used as a substrate material. U.S. Pat. No. 5,648,171 for example, lists high mechanical and thermal strength, good mechanical and thermal stability, thermal undeformabilty, and good aging resistance as requirements. Also listed are good adhesion to glass and copper, good machining properties (punchability, drillability), a low water uptake and high corrosion resistance.

U.S. Pat. No. 5,376,453 notes that resistance to heat deformation is important because the substrate materials are exposed to high temperatures during processing. For example, printed circuit boards are exposed to a temperature of 270° C. during flow soldering. Also temperatures of over 200° C. can occur locally for brief periods during cutting and drilling. In U.S. Pat. No. 5,565,267 the electrically conductive layer is formed with an electrically conductive ink which for most applications would be cured at 200°–230° C. for 30 seconds to 1 hour. Materials with a high glass transition temperature ($T_G$) exhibit favorable characteristics because if this glass transition temperature lies above the mentioned values, then inherent stability is guaranteed and damage such as warping is largely ruled out.

U.S. Pat. No. 5,368,921 mentions that use of fibers which have been surface treated with a silane coupling agent or the like is preferred from the standpoint of water resistance. A silane coupling agent is used in U.S. Pat. No. 5,483,101 between an electrically conductive layer and a layer of resin (benzocyclobutene). U.S. Pat. No. 4,783,345 describes resin materials for the manufacture of prepregs which can be stored.

The use of prepreg materials in the manufacture of chip carriers has become more attractive due to their cost advantage over conventional ceramic materials. Furthermore the electrically conductive layer (usually copper) is more conductive and can be processed more readily to very dense geometries than the paste materials typically applied to ceramic carriers. Chip carriers made with prepregs require many of the same characteristics of the prepregs as other substrates. All of the requirements listed above for substrates made with prepregs have been, at least to some extent, successfully addressed. However, chip carriers usually have an additional requirement for a high insulation resistance when subjected to humidity, temperature, and pressure.

When this insulation resistance requirement is added to the requirements above, no satisfactory combination of these properties has previously been achieved.

As a result, chip carriers made of prepregs must be handled in special moisture tight containers. Once a container is opened such a chip carrier must be soldered to a next level carrier such as a printed circuit board within a relatively short period of time. If such a chip carrier is not used within the time limit it must be slowly baked to remove moisture and again resealed in a moisture tight container. Industry wide specifications have been developed to allow component manufacturers to specify these time limits and handling procedures. Obviously such procedures are a burden to component assemblers because other components, e.g., ceramic, plastic encapsulated, passives, connectors, etc. have no such requirement.

OBJECT OF THE INVENTION

It is therefore an object of the invention to provide a prepreg material which can maintain a high insulation resistance when subjected to moisture, temperature, and pressure stresses.

It is another object to provide such a material for use in chip carrier packages wherein no special handling for moisture susceptibility is needed.

It is a further object to provide such a material in a relatively inexpensive manner particularly adapted to mass production.

It is yet a further object to provide a manner for making such a material which can be accomplished in a facile manner.

These and other objects are attained in accordance with one embodiment of the invention wherein there is provided a fabric material comprising a cloth member having a predetermined maximum thickness and a low percentage by weight of particulates as part thereof, and a hardened resin material substantially encasing the cloth member, including the particulates so that fabric material exhibits a relatively high insulation resistance.

In accordance with another embodiment of the invention there is provided a method of making fabric material exhibiting a high insulation resistance comprising the steps of providing a cloth member having a predetermined maximum thickness and a low percentage by weight of particulates as part thereof, substantially encasing the cloth member, including the particulates with a resin material, and at least partially hardening the resin material.

BEST MODE FOR CARRYING OUT THE INVENTION

For a better understanding of the present invention, together with other and further objects, advantages and capabilities thereof, reference is made to the following disclosure and the appended claims in connection with the above-described drawings.

Figure 1:
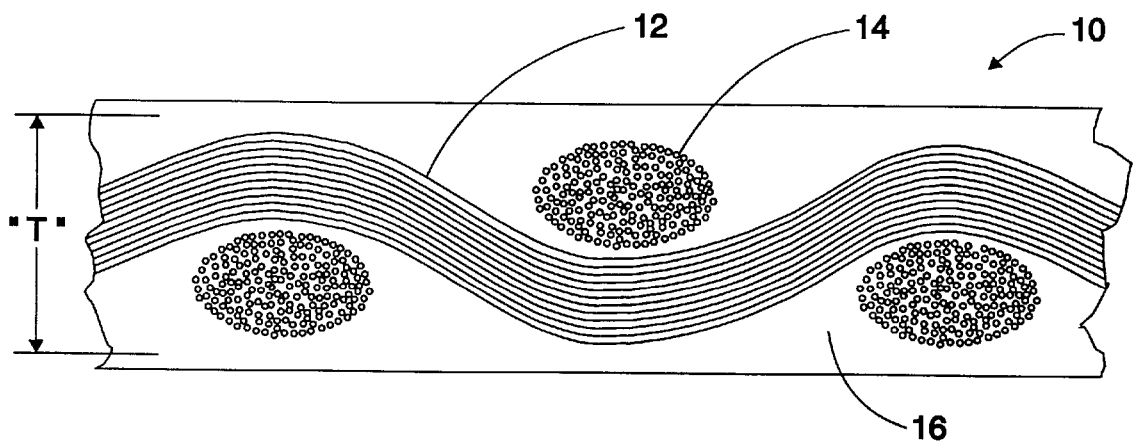
FIG. 1 illustrates in cross section woven cloth of fiber strands with excess coupler, dried film, and gross surface particulates, all surrounded by a resin material.

In FIG. 1 there is shown a magnified cross sectional view of a fabric material 10. The fabric material is composed of a woven cloth of strands 12 and 14 each comprised of pluralities of fibers preferably of fiberglass filaments. Strands 12 run parallel to the paper and strands 14 run into the paper. The woven cloth has a maximum thickness "T" at positions where strands 12 and 14 overlap.

The woven cloth is known to include a quantity of particulates, which term is meant to include dried film, excess coupler, broken filaments, and gross surface debris. For example it is normal to apply a sizing of polyvinyl alcohol, and corn starch and a lubricant of oil to the strands of fiber prior to weaving in order to improve the weaving process and minimize breakage of the strands. After weaving the sizing is removed by a firing step to clean the filaments of lubricants and other materials. However, some sizing is randomly left behind as particulates.

Figure 3:
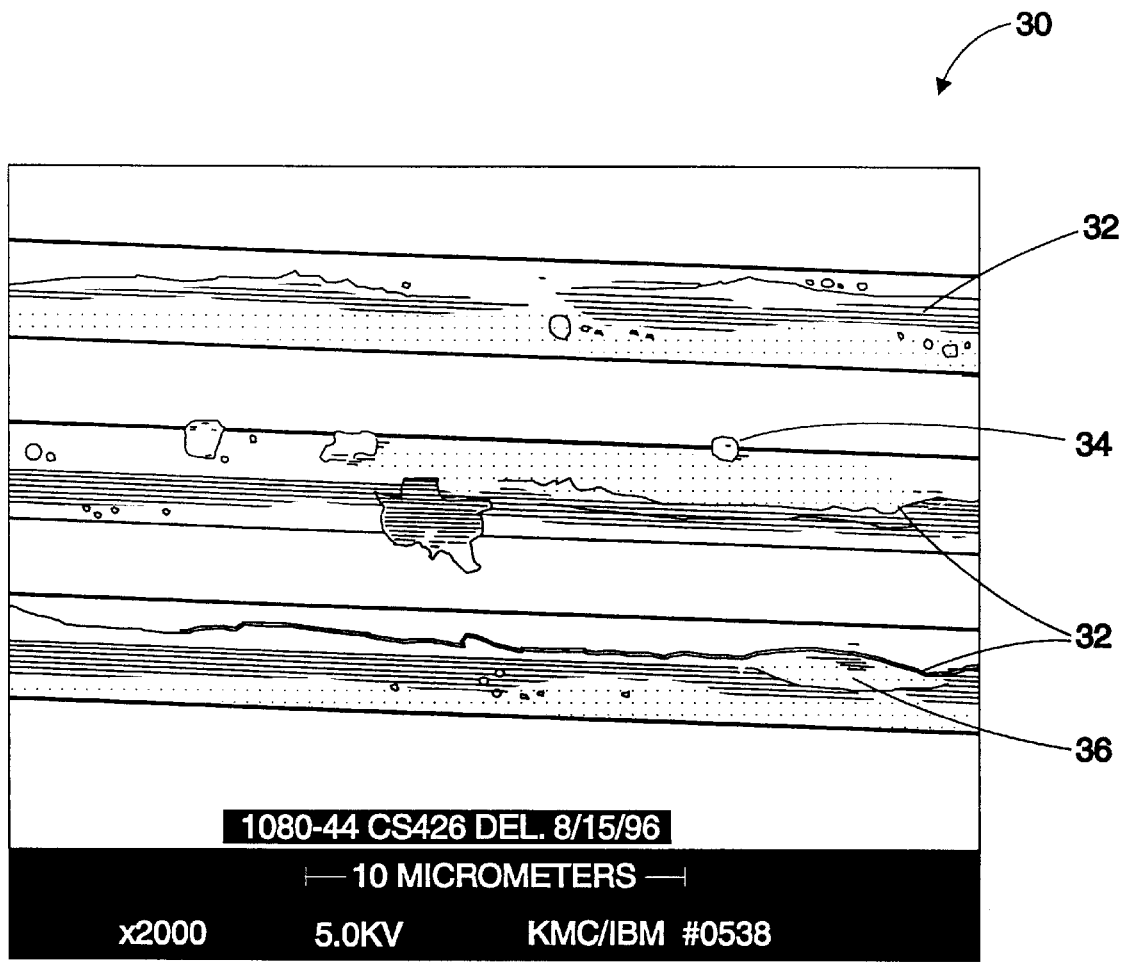
FIG. 3 is a photograph of a magnified portion of glass fiber fabric showing particulates on the fiber strands.

A silane coupler is normally applied to the woven cloth to improve adhesion of resin materials. An excess quantity of coupler if left on the cloth will dry forming particulates scattered randomly throughout the cloth. Broken filaments can produce tiny pieces of filament material (usually glass) particulates. Finally, various airborne and other debris may find its way into the woven cloth and attach itself to the strands of filaments. The photograph of FIG. 3 shows particulates on the strands of woven glass fiber fabric.

Encasing the woven cloth of FIG. 1 including the particulates which are not shown in FIG. 1, is a quantity of hardened resin material 16. (Resin material 16 is not shown with cross-sectioning for illustration purposes.) The resin may be an epoxy resin such as is currently used on a large scale worldwide for FR4 composites. A resin material based on bismaleimide-triazine (BT) is also acceptable. More preferably it is a phenolically hardenable resin material as is known in the art.

As mentioned above the resin material should have a glass transition temperature TG greater than the expected temperature stresses which the fabric material will encounter in subsequent processing and use. Epoxy resins typically have TG of 130° C. BT resins are known to have a $T_G$ of about 200° C. A phenolically hardened resin material with a $T_G$ of about 145° C. or higher is preferable for subsequent use in chip carrier manufacturing. As shown in FIG. 1 the quantity of resin material is sufficient to completely encase the woven cloth and particulates so the thickness of the resulting prepreg fabric material is greater than the maximum thickness of "T" of the woven cloth.

The fabric material of FIG. 1 can be made using a conventional apparatus known as a treater tower wherein a cloth member including any particulates is substantially encased (usually by passing through a liquid bath) with a resin material and then the resin material is at least partially hardened (usually by exposure to heated air).

Figure 2:
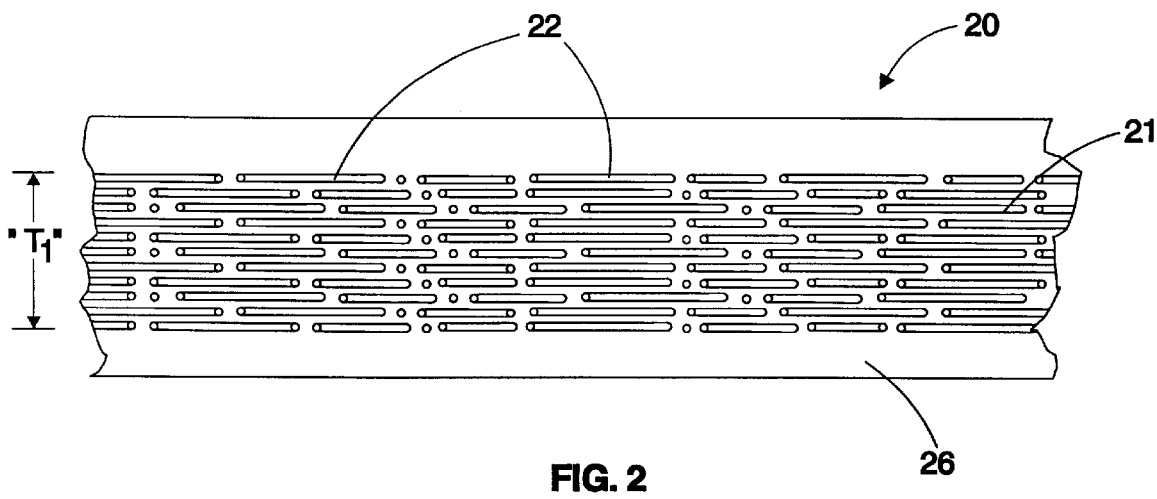
FIG. 2 illustrates in cross section a similar non-woven cloth also surrounded by a resin material.

FIG. 2 shows a fabric material 20 according to another embodiment of the present invention. Non woven cloth member 21 is composed of randomly arranged fibers 22, preferably glass filaments, and has a maximum thickness "$T_1$". There are also particulates mixed with the fibers as in the embodiment of FIG. 1 discussed above. A quantity of hardened resin 26 (not shown with cross-sectioning for illustration purposes) encases the fibers, including the particulates and is of sufficient quantity so the resulting prepreg fabric is thicker than the maximum thickness of "$T_1$" of the non woven cloth 21.

The fabric material of the present invention is particularly suitable for use in the manufacturing of chip carriers. Such electronic packages are particularly sensitive to moisture absorption which can cause damage when the chip carrier is subjected to high temperatures, for example during solder attachment of the chip carrier to a higher level package. The printed circuit industry has developed a set of standards known as Highly-Accelerated Temperature and Humidity Stress Test (HAST), a JEDEC standard No. 22-A110 and associated standards 22-A112 and 22-A113 available from the Electronic Industries Association in Washington, D.C. to measure and specify this moisture susceptibility. For this test the insulation resistance of the fabric material is measured during and after exposure to a specified temperature, humidity, and pressure for a specified time. An insulation resistance below 1 million ohms is considered a failure, indicating a high level moisture absorption.

Components which do not conform to the highest HAST level known as HAST level A may not be acceptable in high reliability chip carrier applications making these undesirable for use in high volume manufacturing. Currently known fabric materials do not reliably pass the HAST level A testing resulting in high yield loss or expensive special handling.

Although all fabric material has some particulates, it has been discovered that fabric material made from a cloth member having a low enough content of particulates and a sufficient quantity of resin material to completely encase the cloth member including the particulates, so that the resin material extends beyond the highest protrusions of the cloth member (i.e. the fabric material is thicker than T of FIG. 1) will pass the HAST level A testing. The level of particulates is measured by examination under a microscope at up to 5000 times magnification.

FIG. 3 is a portion of glass fiber fabric 30 of several glass filaments 32, gross surface debris 34, and dried film 36, at a magnification of 2000 times. In the preferred embodiment, the level of particulates is less than 0.05% by weight of the cloth member which is much less than found in typical cloth members currently used in industry today. Glass fiber woven cloth members suitable for use in the present invention, however, are available from the Asahi-Schwebel company in Japan as trade name AS-450 and the Clark-Schwebel company in Anderson, S.C. as trade name CS-4370.

Thus there has been shown and described a fabric material and method of making the fabric material exhibiting a relatively high insulation resistance. The fabric material has been shown to be particularly suitable for use in chip carrier manufacturing because of its low moisture susceptibility. The invention is thus deemed to constitute a significant advancement in the art.

While there have been shown and described what are at present considered the preferred embodiments of the invention, it will be obvious to those skilled in the art that various changes and modifications may be made therein without departing from the scope of the invention as defined by the appended claims.

What is claimed is:

1. A fabric material having low moisture susceptibility, comprising:
   a cloth member having a predetermined maximum thickness and less than about 0.05 percent by weight of particulates as part thereof; and
   a hardened epoxy resin material having a glass transition temperature of greater than 145 degrees Celsius, substantially encasing said cloth member, including said particulates, said fabric material exhibiting an insulation resistance of greater than about 1,000,000 ohms after exposure to HAST testing.

2. The fabric material of claim 1 wherein said cloth member is a woven cloth.

3. The fabric material of claim 1 wherein said cloth member comprises fiberglass strands.

4. The fabric material of claim 1 wherein said resin material is a phenolically hardened resin material.

5. A method of making fabric material exhibiting an insulation resistance of greater than about 1,000,000 ohms after exposure to HAST testing, comprising the steps of:
   providing a cloth member having a predetermined maximum thickness and less than about 0.05 percent by weight of particulates as part thereof;
   substantially encasing said cloth member, including said particulates with an epoxy resin material having a glass transition temperature of greater than 145 degrees Celsius; and
   at least partially hardening said resin material thereby making said fabric material exhibiting an insulation resistance of greater than about 1,000,000 ohms after exposure to HAST testing.

6. The method of claim 5 wherein said cloth member is provided as a woven cloth.

7. The method of claim 5 wherein said cloth member is provided as fiberglass strands.

8. The method of claim 5 wherein said cloth member, including said particulates, is substantially encased with a phenolically hardenable resin material.

* * * * *